United States Patent [19]

Spencer

[11] 4,157,506
[45] Jun. 5, 1979

[54] FLAME DETECTOR

[75] Inventor: John D. Spencer, Ottawa, Canada

[73] Assignee: Combustion Engineering, Inc., Windsor, Conn.

[21] Appl. No.: 856,444

[22] Filed: Dec. 1, 1977

[51] Int. Cl.$^2$ ............................ H04B 17/14; G08B 21/00
[52] U.S. Cl. ................................................ 328/6; 328/1; 328/94; 340/577
[58] Field of Search ................. 328/1, 6, 94; 340/577, 340/578; 431/24, 25; 307/218

[56] References Cited

U.S. PATENT DOCUMENTS

| | | | |
|---|---|---|---|
| 3,553,664 | 1/1971 | Tucker | 340/578 |
| 3,609,364 | 9/1971 | Paine | 340/578 |
| 3,627,458 | 12/1971 | Wade | 328/6 |
| 3,716,717 | 5/1971 | Scheidweiler et al. | 340/578 |
| 3,940,753 | 9/1974 | Muller | 340/578 |

*Primary Examiner*—Martin H. Edlow
*Assistant Examiner*—B. P. Davis

[57] ABSTRACT

A method and apparatus for processing signals produced by a flame detector. A phase-locked loop is used to generate a binary indication of whether the signal from a flame probe is within a predetermined frequency band. A signal indicative of the average analog value of the resulting pulse train is produced and tested to determine whether it is in a range consistent with flame presence. The resultant binary signal is ANDed with a binary determination of whether the average DC value of the probe signal is within a range consistent with flame presence, and if both the DC and the frequency indications imply possible flame presence, then flame presence is indicated.

24 Claims, 3 Drawing Figures

4,157,506

FLAME DETECTOR

BACKGROUND OF THE INVENTION

The present invention relates to the detection of flame in oil and natural-gas furnaces. In particular, it relates to circuits for processing the signals derived from flame probes or electromagnetic-radiation detectors in order to determine whether or not flame is present.

Various types of sensors are used to detect flames in furnaces. For example, electromagnetic-radiation sensors of various types can be employed to detect the infrared, visible, or ultraviolet radiation emitted from flames and thereby detect flame presence. As another example, flame probes can be used to impress potential differences across the flame area in order to detect currents that are permitted to flow across the potential difference by flame-induced ionization. But the mere presence of ionization current or electromagnetic radiation is not a reliable indication of flame presence, so there remains the question of what to do with the sensor signal in order to be assured of flame presence.

One method of processing the sensor signal is to provide circuits that test the signal for proper amplitude. If enough light or enough current is sensed, then an indication of flame is produced. Though there is some correlation between the output of such a circuit and the presence of flame, the indication that results from this circuit is not entirely satisfactory. Light is not produced only by flames; it can also be produced by glowing furnace walls or ambient light. The flow of current can also be caused by sources other than flame; sometimes there is shorting of the probe to the grounded ignitor horn, causing a large current flow without flame presence. Accordingly, the mere sensing a DC level is not the best means of processing the signal.

Because of the difficulties with the DC signal, some schemes sense alternating currents. Canadian Pat. No. 801,250, for instance, uses a logarithmic detector that indicates flame presence when the ratio of AC-signal amplitude to DC-signal amplitude is sufficiently high. The idea behind this method is ambient ultraviolet light is less likely to flicker than ultraviolet light caused by the presence of a flame. Accordingly, if there is sufficient flicker, then the source of the ultraviolet light must be a flame rather than, say, glowing walls. As a safeguard, this scheme ANDs the logarithmic-detector output with a DC magnitude determination.

Whatever the virtues of this scheme for ultraviolet radiation, it has a drawback when used in a flame-probe apparatus because AC signals can be produced by non-flame sources such as electric ignitors. Canadian Pat. No. 748,015 contains a possible solution to this problem because it proposes detecting AC only in a limited frequency band, a properly selected frequency band should avoid the effect of ignition noise. However, the very limiting of the frequency band could make the requirements of the signal too stringent. Unless the fuel supply is purposely modulated, a flame cannot be counted on always to supply frequency components within the predetermined band.

In light of these limitations in the prior-art devices, it can be appreciated that, while presently known methods have their appropriate applications, a new signal-processing method would be welcome to the art.

SUMMARY OF THE INVENTION

The present invention employs a novel method for determining the absence of flame in a flame-sensing system in which a sensor signal is produced. A binary range indication is set to a first logic level when the sensor signal comes within a predetermined frequency range. When the sensor signal leaves a second predetermined frequency range that includes the first range, the binary range indication is set to a second logic level. An average signal is produced that is representative of the average analog value of the binary range indication, the average signal being influenced in a first direction when the binary range indication is at the first logic level and in a second direction when the binary range indication is at the second logic level. A binary frequency indication is then produced that indicates possible flame presence when the average signal leaves a predetermined magnitude range in the first direction and indicates flame absence when the magnitude of the average signal leaves the predetermined magnitude range in the second direction.

According to the preferred embodiment of the invention, a potential difference is empressed across the region to be monitored, and a flame signal is produced that is indicative of the amount of current flowing through the region in response to the potential difference. The flame signal is then tested to determine whether it indicates average flame current in excess of a first predetermined threshold. When the average exceeds the first predetermined threshold, a binary magnitude signal is set to indicate possible flame presence. if the average flame current drops below a second predetermined threshold, the binary magnitude signal is set to indicate flame absence. This binary magnitude signal is ANDed with the binary frequency indication, previously described, which has been derived from the flame-current signal. The resultant binary output is an indication of the presence or absence of flame.

BRIEF DESCRIPTION OF THE DRAWINGS

These and further features and advantages of the invention become evident in the description of the embodiment shown in the drawings attached, wherein.

DETAILED DESCRIPTION OF THE PREFERRED EMBODIMENT

Figure 1:
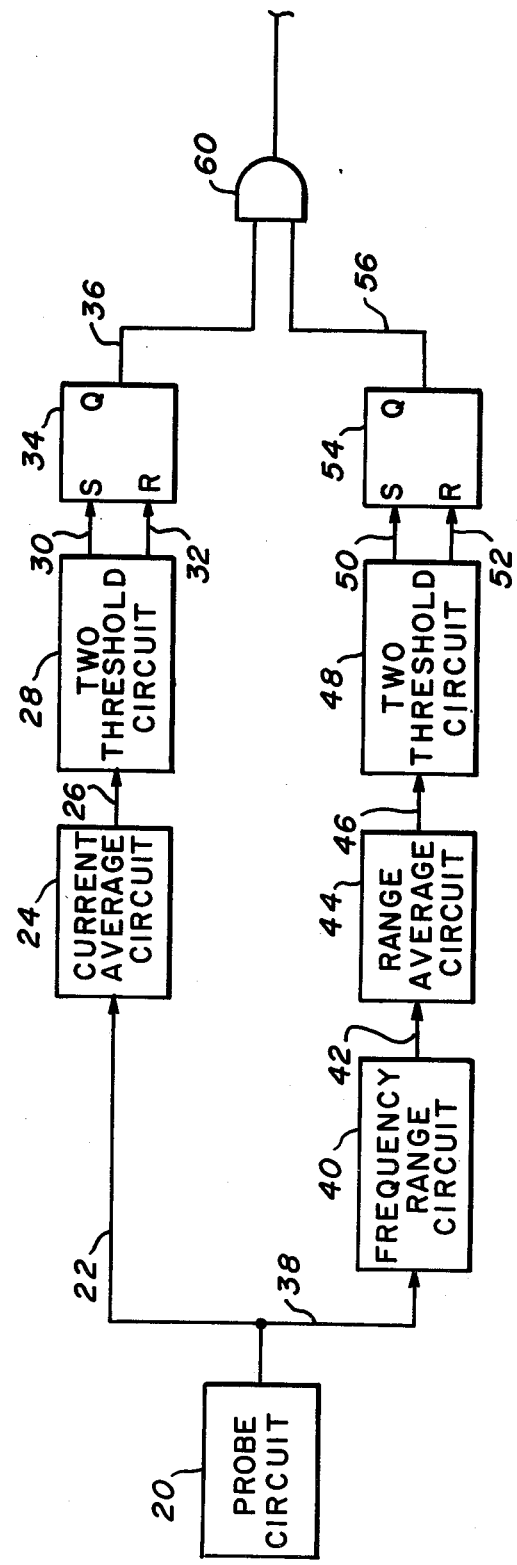
FIG. 1 is a block diagram of a preferred embodiment of the present invention.

FIG. 1 is a block diagram of a signal processing circuit in which the upper signal line is used to determine whether the proper DC-signal magnitude is present in the signal produced by flame-probe circuit 20 and the lower line is used to determine whether frequencies in a predetermined band are present for a high enough proportion of the time. According to the preferred embodiment, probe circuit 20 is one of a number of appropriate means for impressing a DC voltage across the flame area and producing a signal that represents the amount of current that is flowing across the potential difference in the flame area. The potential difference would typically be applied between the flame probe and the ignitor horn. For the purposes of the invention, however, element 20 could be any type of sensor that produces a signal representative of a quantity that varies with the presence and intensity of flame, the most common examples of which are electromagnetic-radiation sensors and flame probes.

The output of probe circuit 20 produces a signal on lines 22 and 38 that is indicative of the amount of current that is flowing in response to the potential difference. Average circuit 24 receives the signal on line 22 and produces an output on line 26 that is indicative of the average value of the signal on line 22. Average circuit 24 would typically be a low-pass filter, so average, for present purposes, does not refer to a strict average over time, because the more recent signals will have a greater effect on the average than those in the more distant past. Average when used to describe the function of circuit 24, refers to the result of removing the short-term variation thereby reacting only to trends in the signal on line 22. Thus, the signal on line 26 is a relatively slowly varying signal compared to that on line 22.

This average signal on line 26 is fed to two-threshold circuit 28, which determines whether or not the average amount of flame current has exceeded a predetermined threshold. If it has, a pulse is produced on line 30 to set flip flop 34. Thereafter, the circuit waits until the average-current level indicated by the signal on line 26 falls below a second threshold. The second threshold is at least as low as, and probably lower than, the first. When the signal falls below the second threshold, a pulse is produced on line 32 to reset flip flop 34. The purpose of having two thresholds rather than one is to provide hysteresis so that chatter will not be produced at the output of flip flop 34. Of course, it is possible for both thresholds to be the same, but it is more desirable to introduce at least a little hysteresis in order to stabilize the operation of the circuit.

Flip flop 34 serves as a memory element for remembering the line on which the most recent pulse has been propagated. Its output on line 36 is the content of this memory, which serves as an indication of whether or not the average DC value of the flame current is consistent with flame presence.

The signal on line 38 is the same as that on line 22, and it is tested in frequency-range circuit 40 for frequency. If the AC portion of signal on line 38 is predominantly a frequency within the range tested for by element 40, a binary level that indicates this will be present on line 42; otherwise, line 42 will be at the other binary level. A sort of hysteresis may be introduced by frequency-range circuit 40; a typical embodiment would include a phase-locked loop, which would lock on to its input signal when the frequency of the signal on line 38 came within a first frequency range, but it would not unlock until the frequency of the signal on line 38 left a slightly wider second frequency range. The binary output of circuit 40 would in that case be an indication of whether or not the phase-locked loop is locked on. The hysteresis that results from such an embodiment is not essential to the operation of the circuit, however, and both frequency ranges could be the same.

The binary output of element 40 is fed by line 42 to a range average circuit 44, which performs approximately the same function as current average circuit 24; the short-term variations are eliminated, while the trends are passed through. There are differences in the details of the two circuits as they are rendered in FIGS. 2 and 3, but these differences are not essential to the working of the invention. In particular, as will be described later, the signal on line 46 is a non-linear function of the average value of the signal on line 42, whereas the signal on line 26 is a substantially linear function of the average of the signal on line 22. Though nonlinear, the signal on line 46 is still representative of the average analog value of the binary indication on line 42. The linearity or lack of it is not important, because the signal on line 46 is fed to a threshold circuit; that is, the signal on line 46 is only tested to see whether it is above a first threshold or below a second threshold.

Circuit 48, like circuit 28, is a circuit with two internal thresholds. The two thresholds define a range, and when the signal on line 46 passes out of that range in one direction, a pulse is produced on line 50; when the signal on line 46 passes out of the range in the other direction, a pulse is produced on line 52. The purpose of this operation is to set flip flop 54 to one state when the signal on line 38 has been within the predetermined range for a sufficiently high percentage of the time and to set it to the other state when the percentage is not sufficiently high. The output of flip flop 54 is therefore an indication of whether the output of probe circuit 20 has satisfied the frequency requirement of the circuit. This indication is ANDed with the signal on line 36, which is an indication of whether the signal output of probe circuit 20 has satisfied the DC requirements of the circuit and the output of the AND gate 60 is thus an indication of whether both of the tests have been met.

Figure 2:
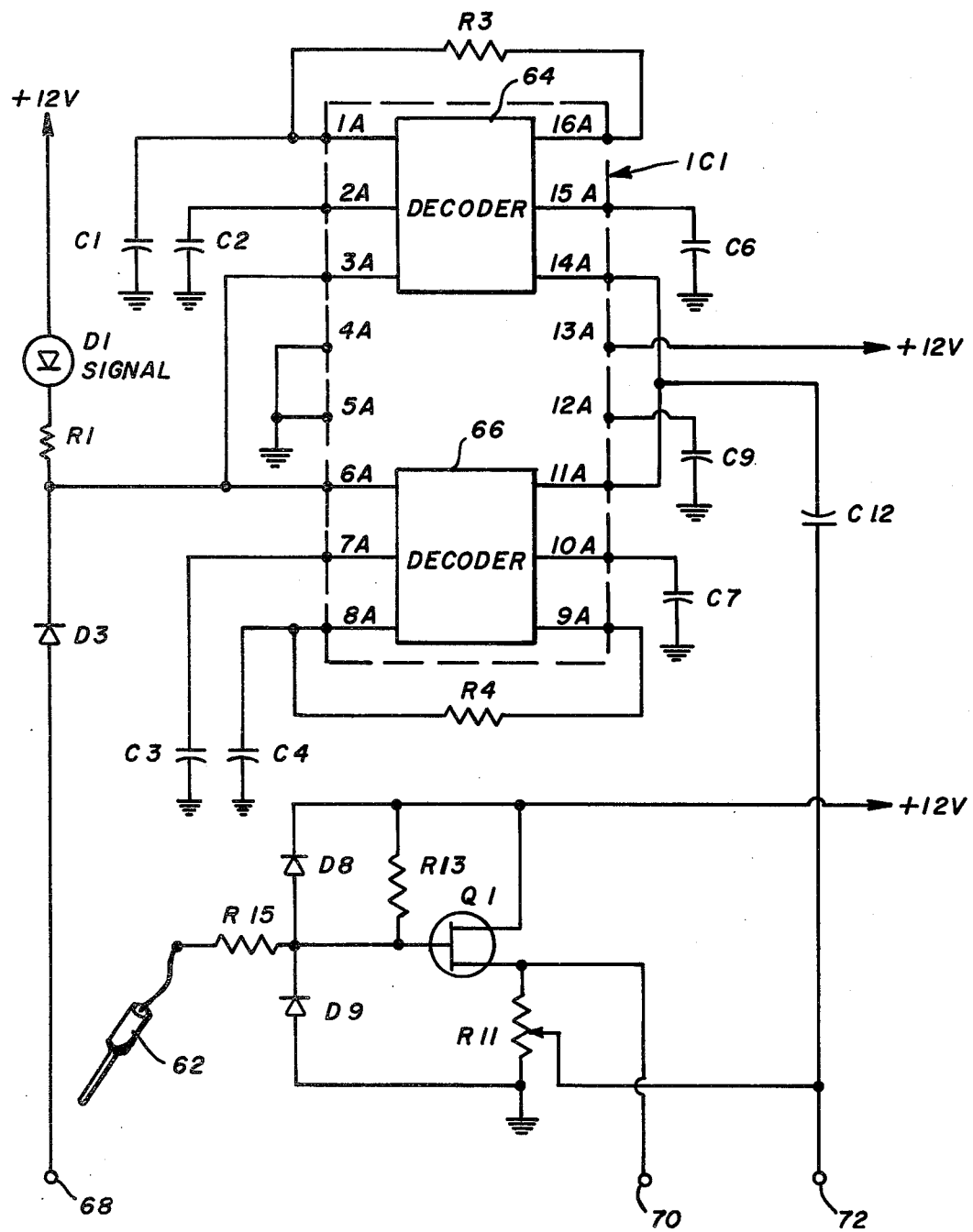
FIG. 2 is part of a schematic diagram of the preferred embodiment of FIG. 1.
Figure 3:
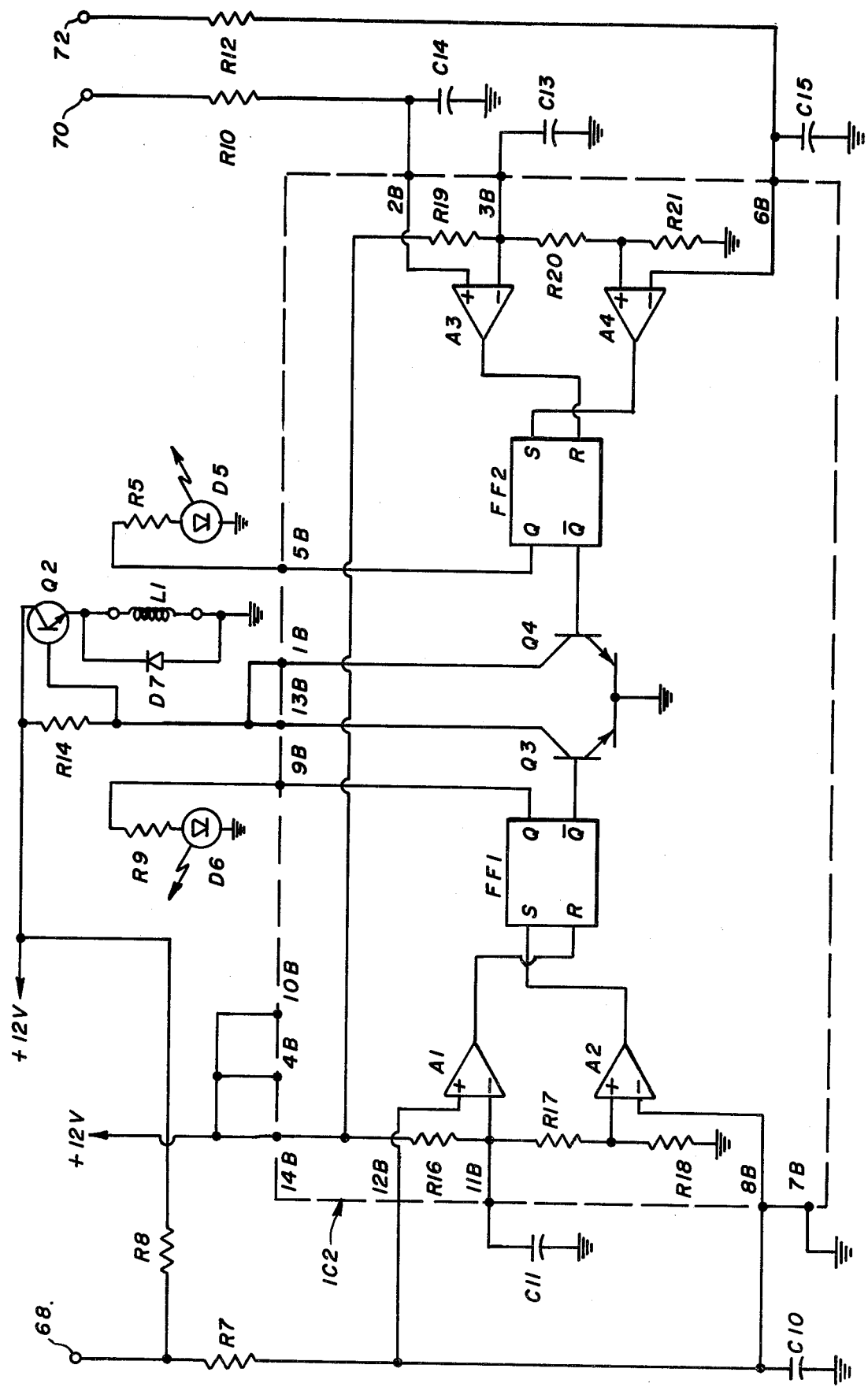
FIG. 3 is the remainder of the schematic diagram of the preferred embodiment.

Specific hardware for implementing the circuit described generally in FIG. 1 is shown in FIGS. 2 and 3. Probe 62 is shown connected to the circuitry represented in block-diagram form in FIG. 1. The probe is placed in the flame area, and when no current flows, the circuit to which it is connected keeps it at a 12-volt potential. The ignitor horn is kept at ground potential, so there is a potential difference between the probe and the horn. When flame occurs in the region between the probe and the horn, ionization caused by the flame permits current flow between the probe and the horn, dropping voltage across the output impedance of the circuit and thereby providing a signal to be processed.

Probe 62, a means for impressing a potential difference across the flame region, is powered by a 12-volt regulated supply that is connected to probe 62 through R13 and R15. The junction of R13 and R15 is connected to ground and to the 12-volt supply by means of normally reverse-biased diodes D8 and D9. These diodes short out any potentials occurring in the flame region that are outside the intended 0-to-12-volt range. The junction of R13 and R15 is also connected to the gate of field-effect transistor Q1, which presents a very high impedance to the R13–R15 junction. The high impedance is necessary because the amount of current that flows between the probe and the horn is low, and in order to obtain measurable voltages, high resistances must be used for R13 and R15. This results in a high output impedance in the R13–R15 circuit.

The source electrode of FET Q1 is connected to the 12-volt source, and the drain electrode is connected through potentiometer R11 to ground. This arrangement allows current to flow from the 12-volt source to ground when the potential at the gate electrode of Q1 is high. Since the potential at the gate electrode of Q1 is dependent on the amount of current allowed to flow through R13 by the flame, the voltage across potentiometer R11 is indicative of the amount of current flowing through the flame. This flame signal is picked off by the wiper of potentiometer R11 and is present at node 72 of FIG. 2, which is identical to node 72 of FIG. 3. The signal on node 72 is AC coupled through C12 to pins 11A and 14A of IC1.

The function of IC1 is to determine whether the frequency of the flame signal at R11 is within a predetermined range. IC1 produces a binary range signal at the common node of terminals 3A and 6A that is low when the signal is within the range and high when it is not. The example shown in FIG. 2 is a dual tone decoder, Exar Integrated Systems' XR2567M. It consists of two tone decoders 64 and 66, which operate by means of phase-locked loops. When the phase-locked loop in decoder 64 locks onto the signal present at pin 14A, it turns on a transistor whose bare collector is connected to pin 3A of IC1. When it loses its lock on the signal at pin 14A, the transistor at terminal 3A is turned off, and no current flows through terminal 3A. Decoder 66 works in the same way, producing an indication at terminal 6A when decoder 66 locks onto the signal at terminal 11A. Terminals 3A and 6A are connected to the 12-volt source through resistor R1 and LED D1. Since both of these terminals are connected internally to bare collectors, it will be appreciated that they are connected in a wire-OR configuration; the junction D3 and R1 goes low when either or both of the decoders is locked onto the signal at the wiper of R11.

Resistor R3 and capacitor C1 are provided, according to the manufacturer's instructions, to set the free-running frequency of the oscillator of the phase-locked loop in decoder 64 to around 45 hertz. Capacitor C2 is chosen to permit a phase-locked-loop bandwidth of 14 percent of the free-running frequency. Thus, an output will be provided at terminal 3A if the frequency of the input signal is within about 7 percent of the free-running frequency. Resistor R4 and capacitors C3 and C4 are similarly picked to provide a free-running frequency of around 180 hertz and a bandwidth of about 14 percent in decoder 66. Accordingly, if the frequency is in either of those two bands, a low logic level will appear at the junction of D3 and R1. The remaining elements connected to IC1 are provided according to the manufacturer's instructions for power and regulation of the integrated circuit.

As was previously indicated, phase-locked-loop embodiments of the means for producing a binary range output exemplified by IC1 and its related circuitry may remain locked onto frequencies that would not have caused them to lock on initially. Accordingly, the means for producing a binary range output is characterized by two perdetermined frequency ranges, the first range being contained within the second. The output does not assume its first logic level, indicative of a frequency within the tested-for range, until the frequency of the input enters the first range. Once the first logic level has been set, however, it stays set, even if the frequency leaves the first range, as long as the frequency stays within the second range.

It should be observed at this point that the signal from the flame probe typically contains many frequency components; the test of whether the sensor signal comes within the frequency range is passed when the signal has frequency components within either decoder lock-on bandwidth that are a sufficiently large part of the total signal. For example the integrated circuit used in the preferred embodiment locks onto an inband component of a signal if that component is greater in magnitude than 6 db below the total out-of-band signal.

As was stated before, current is drawn by IC1 from the D3-R1 junction when the signal from the wiper of R11 is within either of the predetermined bands that in combination make up a composite frequency range. When this current is drawn, diode D1 emits light, an indication that the frequency is present. The current also drops voltage across D1 and R1, producing a binary range signal at the D3-R1 junction. This signal is fed through diode D3 to node 68, which is the junction of resistors R7 and R8 of FIG. 3. R7 and R8 are part of the charging circuit for capacitor C10, the voltage across which is fed by means of terminals 8B and 12B of IC2 to comparators A2 and A1, respectively.

A voltage divider comprising R16, R17, and R18 provides two reference voltages, the higher one being applied to A1 and the lower one being applied to A2. An external capacitor C11 provides an AC short between the upper reference-voltage source and ground. The two reference voltages define a range of voltages that introduces hysteresis into the system. Comparator A1 responds with a positive-going voltage change when the voltage across C10 leaves the range in the position direction, and comparator A2 responds with a position-going voltage change when the voltage across C10 leaves the range in the negative direction. Since the S and R inputs of R-S flip-flop FF1 both respond to position-going signals, the Q output does not go high until the C10 voltage exceeds the upper reference voltage, but it then stays high until the C10 voltage drops below the lower reference voltage. This type of arrangement helps to avoid chatter at the output of FF1. (In this and the remainder of the description of the internal operation of IC2, the circuits shown are the functional equivalents of the IC2 circuits though the exact details may vary somewhat from the active internal circuiting of the integrated circuit.)

Flip flop FF1 serves to provide an indication of whether or not the probe signal has the proper frequency content. The indication of proper frequency content is provided at the Q output, which is high when the proper frequency content is present so that it lights LED D6 by supplying current through R9. The indication is also provided at the $\overline{Q}$ output, which goes low when the frequency content is present, thereby keeping transistor Q3 turned off.

It is noted that the binary frequency signal does not indicate instantaneous frequency content, but only average frequency content. Thus, even if the signal at the junction of D3 and R1 is not low, the binary frequency indication could still indicate proper frequency content if the signal at the D3-R1 junction had been low for a percentage of the time high enough to prevent C10 from reaching too high a voltage.

Another arrangement similar to that just described is used to determine whether the amount of flame current is high enough. The signal at the wiper of R11 is fed from node 72 through R12 to C15. The R12–R15 circuit acts as a low-pass filter, receiving the flame signal and producing an average magnitude signal. This is somewhat similar to the action of the D3-R7-R8-C10 circuit, which also performs an averaging function, but the R12-C15 circuit is linear in that the voltage on C15 is substantially a linear function of the "average" value (as explained above) of the signal at the wiper of R11. In contrast, while the signal at the D3-R1 junction causes a signal on C10 that is an indication of the average of the value at the D3-R1 junction, that indication is not a linear function of the output of IC1. This is because a low signal at the junction of R7 and R8 discharges capacitor C10 faster than a high signal at the junction of R7 and R8 allows it to charge. Though this emphasizes the effect of a low (frequency present) signal, a signal is still produced at C10 that is a function of the average of the signal at the D3-R1 junction.

The voltage across C15 is fed to comparator A4 through terminal 6B of IC2. There it is compared to a low threshold provided by the R19-R20-R21 voltage divider. Comparator A3 is provided, via terminal 2B of IC2, with a signal appearing across C14. Since C14 has the same value as C15, and R10, which connects the drain of Q1 to C14, has the same value as R12, the voltage across C14 is proportional to the voltage across C15. (The resistance of R11 is negligible compared to that of R12). Thus, a signal proportional to, but greater than, the signal fed to A4 is fed to A3, and the result is that the hysteresis produced by the A3-A4 circuit is less than the hysteresis provided by the A1-A2 circuit. A3 and A4 reset and set FF2 in a manner similar to that in which A1 and A2 reset and set FF1, so the output of FF2 is an indication of whether the average magnitude signal is low enough—that is, whether the current through the flame is high enough—to permit a flame indication.

FF2 provides two binary magnitude signals, one at Q and one at $\overline{Q}$. The Q output, which indicates possible flame presence by a high signal, is connected to LED D5 by means of resistor R5 and terminal 5B of IC2, giving a visual indication of whether the average flame current is sufficiently high. The $\overline{Q}$ output, which indicates possible flame presence by a low signal, is connected to the base of Q4; when Q4 is off, sufficient flame current is indicated.

The collectors of Q3 and Q4 are tied together and have a common load, R14, which is connected to the 12-volt source. A high signal at the lower side of R14 is only present when both the $\overline{Q}$ output of FF1 and the $\overline{Q}$ output of FF2 are low, so a wired AND is achieved. That is, the lower side of R14 goes low only when both the frequency and the magnitude tests have been passed. The signal at the lower end of R14 is applied to the base of Q2, which drives L1, the coil of a relay not shown, and the relay causes the appropriate response to flame presence. The combination of Q2, Q3, Q4 and L1 is accordingly a means for receiving the binary magnitude and frequency signals and producing an indication of flame presence only when both the binary magnitude and binary frequency signals indicate possible flame presence. Diode D7 is included in parallel with L1 in order to prevent excessive di/dt voltage from L1 and thereby protect Q2.

In operation, voltage is applied, to the probe, and if there is no flame in the region to be monitored, no current is drawn through R13 and R15. As a result, the voltage at the gate of Q1 biases it all the way on, resulting in a signal of about 11 volts at the drain of Q1. This signal is fed through R10 to C14, charging it high enough to reset FF2. This makes the $\overline{Q}$ output of FF2 high, thereby turning on Q4 and maintaining a low signal at the base of Q2. Thus, there is an indication of no flame. It is noted, however, that it is not necessary for Q4 to be on to indicate flame absence. The signal at the wiper of R11 is also sent to the input of decoders 64 and 66. Since this signal is a steady high signal, neither decoder detects its predetermined frequency, so current is not drawn by either terminal 3A or terminal 6A. Accordingly, a high signal is present at the D3-R1 junction, back biasing D3 and allowing C10 to charge to a relatively high voltage. This voltage is fed by means of terminal 12B to comparator A1, which resets FF1, thereby turning on Q3 and keeping Q2 turned off.

This condition remains until it is attempted to ignite the burner, typically with an electric ignitor. The electric ignitor will often cause a strong electric field in the region to be monitored, and the high-input-impedance probe circuit sometimes picks up signals from the electric ignitor. To the extent that the result of the signal at the R13-R15 junction tends to exceed 12 volts or drop below ground potential, resultant signals are shorted out by D8 or D9. However, that part of the noise signal from the electric ignitor that is between zero volts and 12 volts will be passed to the gate of Q1, thereby affecting the voltage at the wiper of potentiometer R11. The decoders in IC1 are typically tuned to avoid the 60-hertz line frequency and its 120-hertz harmonic. However, it could occur that the noise signal would have strong frequency components in the composite frequency range created by decoders 64 and 66. Since the frequency content of the signal at the R11 wiper can be expected to vary quite a bit, pulses could appear at terminals 3A and 6A of IC1. If the average duty cycle of these pulses is sufficiently high, capacitor C10 is discharged to a voltage low enough to cause the output of A2 would go high, setting FF1 and thereby turning off Q3. Q2 will not be turned on, however, since the DC level at the wiper of potentiometer R1 is not low enough to cause the $\overline{Q}$ output of FF2 to go low, so Q4 is not turned off. Accordingly, a potentially incorrect result is avoided because the circuit senses both absolute DC values and the presence of the chosen frequencies.

The circuit also avoids the incorrect indication that would result in a DC-only system from the shorting of the probe to the horn due to the buildup of combustion products. The shorting would draw current through R13 and result in the $\overline{Q}$ output of FF2 going low. The base of Q2 would remain low, however, because the frequency components necessary to turn off Q3 would not be present. Again, the ANDing of the two indications avoids an incorrect indication.

When flame is actually present between the probe and the horn, a varying amount of current is drawn through R13 by the probe and the flame. This causes both the average DC level at the wiper of potentiometer R1 to drop and a significant AC component to be present there. As was mentioned before, an output will be produced at terminals 3A and 6A of IC1 if the AC component of the signal at the wiper of potentiometer R1 is within the composite frequency band. Of course, the AC component would typically have many frequency components in it, and the frequency-component makeup of the signal will vary with time. But an output will be produced by IC1 during any time in which the frequency component in either band selected by the decoders is greater in magnitude than 6 db below the level of the out-of-band signals. Flame presence causes the IC1 output to be present for a high enough proportion of the time to keep C10 below the upper threshold set by the R16-R17-R18 network. Therefore, FF1 remains set after C10 has once been brought below the lower threshold set by that network. Though R16, R17, and R18 are equal in resistance, it is not required that the frequencies of interest be present for at least two thirds of the time before FF1 is initially set; the resistance of the charging path of C10 is 570 kilohms, while that of the discharge path is only 100 kilohms, so discharging takes place more than five times as fast as charging. Depending on various tolerances, diode drops, etc., therefore, the in-band time need only be about one third of the total time in order to produce an initial indication of proper frequency content.

Experience has shown that the frequencies selected, about 45 hertz and about 180 hertz, with bandwidths of around 14 percent on each, will provide sufficient in-band time to set FF1 when flame is actually present, regardless of the shape of the ignitor horn. Thus, FF1 will be set if flame is present, and it will stay set until the absence of flame allows C10 to charge to a voltage above the upper threshold. Transistor Q3 is therefore turned off, and the low DC outputs on nodes 70 and 72 will result in Q4 remaining off. Transistor Q2 will accordingly energize L1, and flame presence will be indicated.

Though the invention has been described in terms of a preferred embodiment, it will be appreciated by those skilled in the art that many alterations, modifications, and variations are apparent in view of the foregoing description. The claims are therefore intended to encompass all such alterations, modifications, and variations as fall within their broad scope.

What is claimed is:

1. In a flame-sensing method in which a sensor signal is produced by monitoring, with an appropriate sensor, a region in which flame is to be detected, a method of detecting the absence of flame in the region, comprising:
   a. setting a binary range indication to a first logic level when the sensor signal comes within a first predetermined frequency range;
   b. setting the binary range indication to a second logic level when the sensor signal leaves a second predetermined frequency range that includes the first predetermined frequency range;
   c. producing an average signal representative of the average analog value of the binary range indication, the first logic level in the binary range indication thereby influencing the average signal in a first direction, and the second logic level in the binary range indication thereby influencing the average signal in a second direction;
   d. setting a binary frequency indication to indicate the possible presence of flame when the average signal leaves a predetermined magnitude range in the first direction; and
   e. setting the binary frequency indication to indicate the absence of flame when the magnitude of the average signal leaves the predetermined magnitude range in the second direction.

2. A method as recited in claim 1, wherein:
   a. the binary range indication is set to the first logic level when a signal indicative of the conductivity in the region to be monitored comes within the first predetermined frequency range; and
   b. the binary range indication is set to the second logic level when the signal indicative of conductivity leaves the second predetermined frequency range.

3. A method as recited in claim 2, wherein the first predetermined frequency range includes 40 hertz and 180 hertz.

4. A method as recited in claim 3, wherein the first frequency range includes frequencies between about 37 hertz and about 43 hertz and between about 167 hertz and about 193 hertz.

5. A method as recited in claim 4 wherein the first frequency range consists of frequencies between about 37 hertz and about 43 hertz and between about 167 hertz and about 193 hertz.

6. A method as recited in claim 1, wherein the first frequency range includes 40 hertz and 180 hertz.

7. A method as recited in claim 6, wherein the first frequency range includes frequencies between about 37 hertz and about 43 hertz and between about 167 hertz and about 193 hertz.

8. A method as recited in claim 7, wherein the first frequency range consists of frequencies between about 37 hertz and about 43 hertz and between about 167 hertz and about 193 hertz.

9. An apparatus for detecting the absence of flame in a region to be monitored, comprising:
   a. an appropriate sensor for monitoring the region and producing a sensor signal that is representative of a quantity with the intensity of flame;
   b. means for receiving the sensor signal and producing a binary range output that assumes a first logic level when the sensor signal comes within a first predetermined frequency range and assumes a second logic level when the sensor signal leaves a second predetermined frequency range, which second range includes the first frequency range;
   c. means for receiving the binary range output and producing an average signal that is indicative of the average of the analog value of the binary range output, the average signal thereby being influenced in a first direction when the binary range output is at the first logic level and in a second direction when the binary range output is at the second logic level; and
   d. means for receiving the average signal and producing a binary output that assumes a possible-flame-presence state when the magnitude of the average signal leaves a predetermined magnitude range in the first direction and assumes a flame-absence state when the magnitude of the average signal leaves the predetermined magnitude range in the second direction.

10. An apparatus as recited in claim 9, wherein the sensor is a means for impressing a potential difference across the region and producing a sensor signal that is indicative of the amount of current flowing through the region in response to the potential difference.

11. An apparatus as recited in claim 10, wherein the first frequency range includes 40 hertz and 180 hertz.

12. An apparatus as recited in claim 11, wherein the first frequency range includes frequencies between about 37 and about 43 hertz and between about 167 and about 193 hertz.

13. An apparatus as recited in claim 12, wherein the first frequency range consists of frequencies between about 37 hertz and about 43 hertz and between about 167 hertz and about 193 hertz.

14. An apparatus as recited in claim 13, wherein the first frequency range includes 40 hertz and 180 hertz.

15. An apparatus as recited in claim 14, wherein the first frequency range includes frequencies between about 37 hertz and about 43 hertz and between about 167 hertz and 193 hertz.

16. An apparatus as recited in claim 15, wherein the frequency range consists of frequencies between about 37 hertz and 43 hertz and between about 167 hertz and about 193 hertz.

17. A method for determining whether flame is present in a region to be monitored, comprising the steps of:
   a. impressing a potential difference across the region to be monitored;
   b. producing a flame signal indicative of the amount of current flowing through the region in response to the potential difference;
   c. producing an average-current signal indicative of the average value of the flame signal;
   d. setting a binary magnitude signal to indicate possible flame presence when the average-current signal indicates an average current in excess of a first predetermined threshold;
   e. setting the binary magnitude signal to indicate flame absence when the average-current signal indicates an average current below a second predetermined threshold;
   f. setting a binary range indication to a first logic level when the flame signal contains frequency components within a first frequency range that are greater in magnitude than a first predetermined minimum;
   g. setting the binary frequency range indication to a second logic level when the flame signal does not contain frequency components within a second range including the first range, that are greater in magnitude than a second predetermined minimum;
   h. producing an average range signal that is indicative of the average of the analog value of the binary range indication, the average range signal thereby being influenced in a first direction when the binary range indication is at the first logic level and in a second direction when the binary range indication is at the second logic level;
   i. setting a binary frequency indication, when the average range signal passes out of a predetermined magnitude range in the first direction, to indicate possible flame presence;
   j. setting the binary frequency indication, when the average range signal passes out of the predetermined magnitude range in the second direction, to indicate flame absence;
   k. indicating flame presence when both the binary frequency and the binary magnitude indications indicate possible flame presence; and
   l. indicating flame absence when either or both of the binary frequency and magnitude indications indicate flame absence.

18. A method as recited in claim 17, wherein the frequency range includes 40 hertz and 180 hertz.

19. A method as recited in claim 18, wherein the frequency range includes frequencies between about 37 hertz and about 43 hertz and between about 167 hertz and about 193 hertz.

20. A method as recited in claim 19, wherein the frequency range consists of frequencies between about 37 hertz and about 43 hertz and between about 167 hertz and about 193 hertz.

21. An apparatus for determining the presence of flame in a region to be monitored, comprising:
   a. means for impressing a potential difference across the region to be monitored and producing a flame signal indicative of the amount of current flowing through the region in response to the potential difference;
   b. means for receiving the flame signal and for producing an average magnitude signal indicative of the average value of the flame signal;
   c. means for receiving the average magnitude signal and producing a binary magnitude signal that is set to indicate possible flame presence when the average current signal indicates an average flame current in excess of a first predetermined threshold and set to indicate flame absence when the average-current signal indicates an average flame current that is less than a second predetermined threshold;
   d. means for receiving the flame signal and producing a binary range signal that is set to a first logic level when the flame signal contains frequency components within a first range that are greater in magnitude than a first predetermined minimum and are set to a second logic level when the flame signal does not contain frequency components within a second range that are greater in magnitude than a second predetermined minimum, the second frequency range including the first frequency range;
   e. means for receiving the binary range signal and producing an average frequency signal that is proportional to the average of the analog value of the binary range indication, the average range signal thereby being influenced in a first direction when the binary range signal is at the first logic level and being influenced in a second direction when the binary range signal is at the second logic level;
   f. means for receiving the average frequency signal and producing a binary frequency signal that is set to indicate possible flame presence when the average frequency signal passes out of a predetermined magnitude range in the first direction and is set to indicate flame absence when the average frequency signal passes out of the predetermined magnitude range in the second direction; and
   g. means for receiving the binary magnitude and frequency signals, for producing an indication flame presence when both the binary magnitude and binary frequency signals indicate possible flame presence, and producing an indication of flame absence when either or both of the binary magnitude and frequency signals indicate flame absence.

22. An apparatus as recited in claim 21, wherein the frequency range includes 40 hertz and 180 hertz.

23. An apparatus as recited in claim 22, wherein the frequency range includes frequencies between about 37 hertz and about 43 hertz and between about 167 hertz and about 193 hertz.

24. An apparatus as recited in claim 23, wherein the frequency range consists of frequencies between about 37 hertz and about 43 hertz and between about 167 hertz and about 193 hertz.

* * * * *